(12) United States Patent
Nagaoka

(10) Patent No.: US 6,329,285 B1
(45) Date of Patent: *Dec. 11, 2001

(54) PLUG FABRICATING METHOD

(75) Inventor: Koujiro Nagaoka, Kagoshima (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,386

(22) Filed: Aug. 10, 1999

(30) Foreign Application Priority Data

Aug. 10, 1998 (JP) .................................. 10-225794

(51) Int. Cl.⁷ .............................................. H01L 21/4763
(52) U.S. Cl. .......................... 438/637; 438/396; 438/675; 438/689
(58) Field of Search ..................... 438/637, 639, 438/647, 648, 675, 396, 638, 649, 689, 690, 700, 711

(56) References Cited

U.S. PATENT DOCUMENTS 5,078,833 * 1/1992 Kadomura ............................ 438/637
5,441,594 * 8/1995 Zenke .................................. 438/396

* cited by examiner

Primary Examiner—Charles Bowers
Assistant Examiner—Yennhu B. Huynh
(74) Attorney, Agent, or Firm—Sonnenschein, Nath & Rosenthal

(57) ABSTRACT

A plug fabricating method, capable of fabricating a minute plug with a good configuration, reducing scum and simplifying the plug fabricating process, makes an inter-layer insulating film on a Si substrate and forms a contact hole in the inter-layer insulating film. A direct contact layer in form of a Ti/TiN film is formed on the inter-insulating, film to also cover the bottom surface and the side wall of the contact hole. After a W film is formed on the entire surface in a deposition chamber, $ClF_3$ gas exhibiting a strong reducing property is supplied as an etching gas into the deposition chamber, and the W film and the direct contact layer are partly removed an by etch-back processing using gas etching by the $ClF_3$ gas. As a result, a contact plug of W deposited on the direct contact layer as the base is formed inside the contact hole.

20 Claims, 7 Drawing Sheets

PLUG FABRICATING METHOD

RELATED APPLICATION DATA

The present application claims priority to Japanese Application No. P10-225794 filed Aug. 10, 1998, which application is incorporated herein by reference to the extent permitted by law.

BACKGROUND OF THE INVENTION

1. Technical Field

This invention relates to a plug fabricating method especially suitable for application to fabrication of a connection hole plug and a contact plug made of tungsten.

2. Description of the Related Art

Recently, along with progressive micro-sizing of semiconductor devices, wirings are getting more and more multi-layered when manufacturing semiconductor devices. As a result, steps in manufacturing, processes of connection hole plugs and contact plugs (hereinafter generically called contact plugs) are increasing, and manufacturing processes of semiconiductor devices are getting more and more complex.

A process for fabricating a contact plug is concretely explained below.

As shown in FIG. 1, after an inter-layer insulating film 102 of $SiO_2$ is formed on a Si substrate 101, a resist pattern (not shown) with a predetermined configuration is made on the inter-layer insulating film 102. After that, using the resist pattern as a mask, the inter-layer insulating film 102 is etched by reactive ion etching (RIE) to form a contact hole 103. The resist pattern is removed thereafter. Then, a titanium (Ti) film and a titanium nitride (TiN) film are sequentially formed on the inter-layer insulating film 102, also covering the side wall and the bottom surface of the contact hole 103, to make a direct contact layer 104 of Ti/TiN. After that, within a deposition chamber (not shown), a W film 105 is formed on the entire surface of the inter-layer insulating film 102 by blanket tungsten chemical vapor deposition (blanket W—CVD) so as to bury the inside of the contact hole 103.

Next as shown in FIG. 2, the Si substrate 101 is moved into an etching chamber (not shown), and the W film 105 is partly removed by etch-back by RIE using sulfur hexafluoride (SF6) gas as the plasma etching gas.

Next as shown in FIG. 3, the direct contact layer 104 is partly removed by etch-back to expose the top surface of the inter-layer insulating film 102 by RIE using Cl2 as the plasma etching gas. As a result, a contact plug 106 of W deposited on the Ti/Tn contact film as the base is formed inside the contact hole 103.

This conventional process for fabricating a contact plug, however, involved the following problems. That is, as reviewed above, when the contact plug 106 is formed, the direct contact layer 104 such as Ti/TiN film must be made before the W film 105 is formed by blanket W—CVD). Additionally, not limited to the Ti/TiN film mentioned above, various kinds of structures may be used as the direct contact layer 104, depending upon the process actually employed. Therefore, etch-back processing had to be done for a plurality of layers including, W film and direct contact layer while coping with any one of such various kinds of structures of the direct contact layer.

Moreover, according to the Inventor's own knowledge, when the direct contact layer 104 is etched, chemical reaction products 107 like titanium fluoride ($TiF_x$) as shown in FIG. 2 are produced and undesirably remain because of influences of residual fluorine (F) in the etching chamber. These reaction products 107 such as $TiF_x$ invite generation of etching scum 108 on the inter-layer insulating film 102 as shown in FIG. 3, and the etching scum 108 invite a decrease in reliability of the wiring formed on an upper layer.

Furthermore, when the contact plug 106 is formed, different chambers were used for the step of depositing the W film 105, that is, the step of burying W inside the contact hole 103, and for the step of etch-back of the W film 105. Therefore, the process for fabricating the contact plug was inevitably complicated.

SUMMARY OF THE INVENTION

It is therefore an object of the invention to provide a plug fabricating method capable of fabricating a minute plug with a good configuration reducing the scum produced during fabrication of the plug, and improving the reliability of a wiring formed on an upper layer.

According to the invention, there is provided a plug fabricating method comprising the steps of:

forming an opening in an insulating film on a substrate;

forming a conducting film to bury the opening; and partly removing the conducting film by etch-back processing to maintain the conducting film inside the opening, the etch-back processing being conducted by using an etching gas containing at least a chlorine trifluoride gas.

In the present invention, etch-back processing of the conducting film is typically executed in a deposition chamber for forming the conducting film in order to simplify the plug fabricating process. Additionally, in the present invention, the etch-back processing of the conducting film formed in the deposition chamber is preferably executed consecutively in the same deposition chamber.

In the present invention, a wiring is typically formed in connection with the conducting film inside the opening after the etch-back processing of the conducting film in order to make a multi-layered wiring.

In the present invention, the conducting film is preferably made by chemical vapor deposition (CVD). Concretely, when the conducting film is made of tungsten, blanket tungsten chemical vapor deposition is used.

According to the plug fabricating method having the above-summarized construction according to the invention, by using an etching gas containing at least chlorine trifluoride for the etch-back processing of the conducting film, the etching scum can be reduced.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
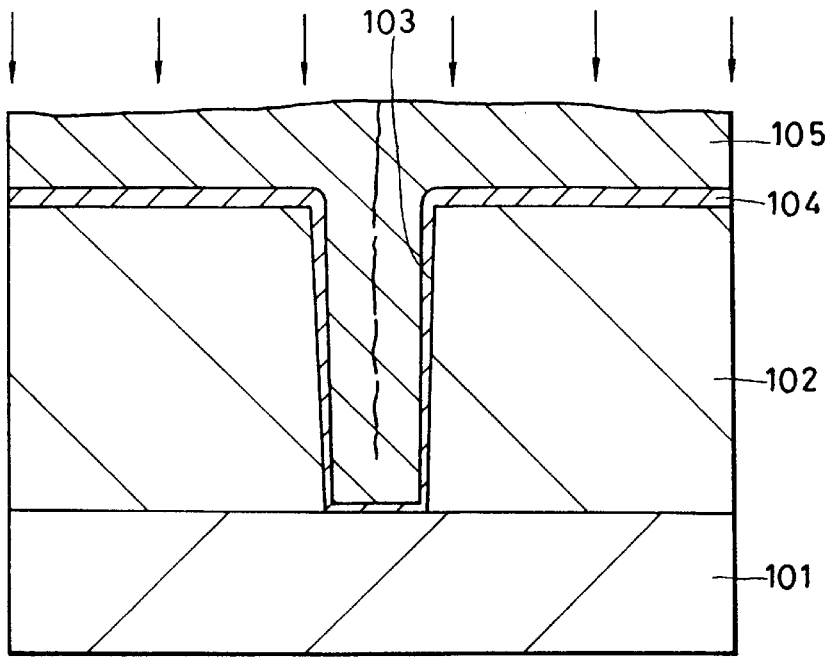
FIG. 1 is a cross-sectional view for explaining a conventional method for fabricating a contact plug.
Figure 2:
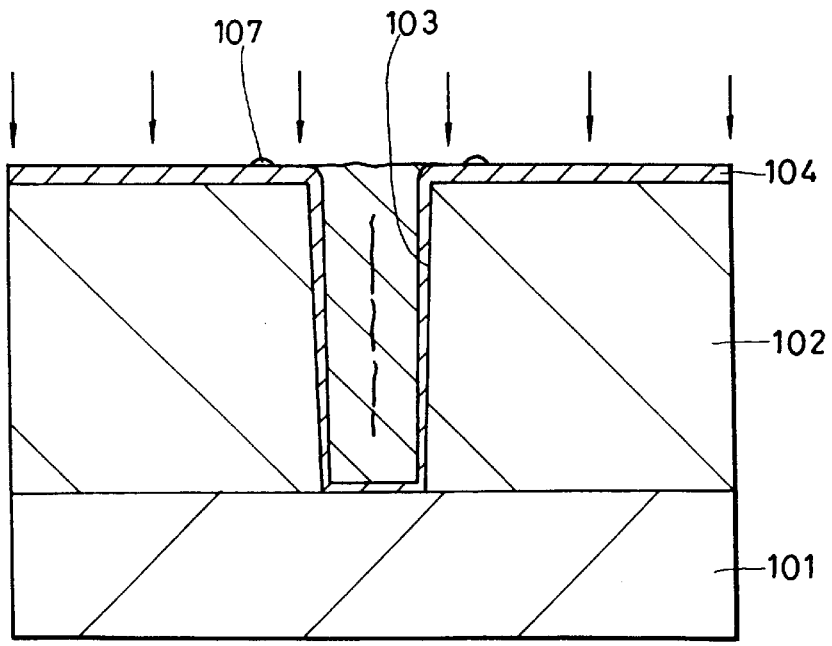
FIG. 2 is a cross-sectional view for explaining the conventional method for fabricating a contact plug and problems involved therein.
Figure 3:
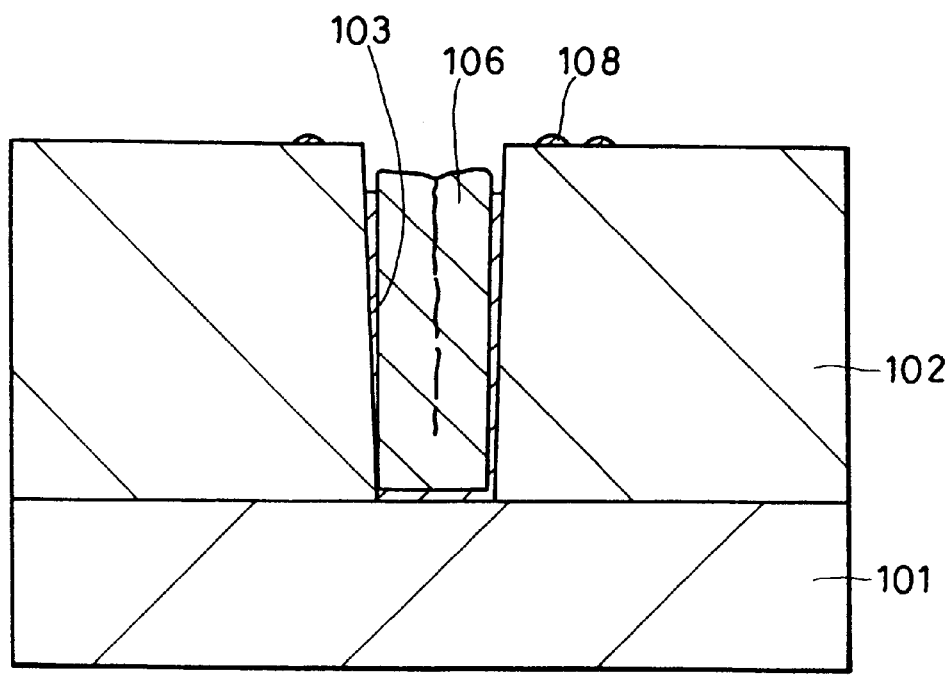
FIG. 3 is a cross-sectional view for explaining the conventional method for fabricating a contact plug and problems involved therein.

Embodiments of the invention are explained below with reference to the drawings. In all of the drawings illustrating embodiments of the invention, the same or equivalent portions are labeled with common reference numerals.

A contact plug fabricating method according to the first embodiment of the invention is explained as follows. FIGS. 4A through 6B show the contact plug fabricating method according to the first embodiment.

Figure 4A:
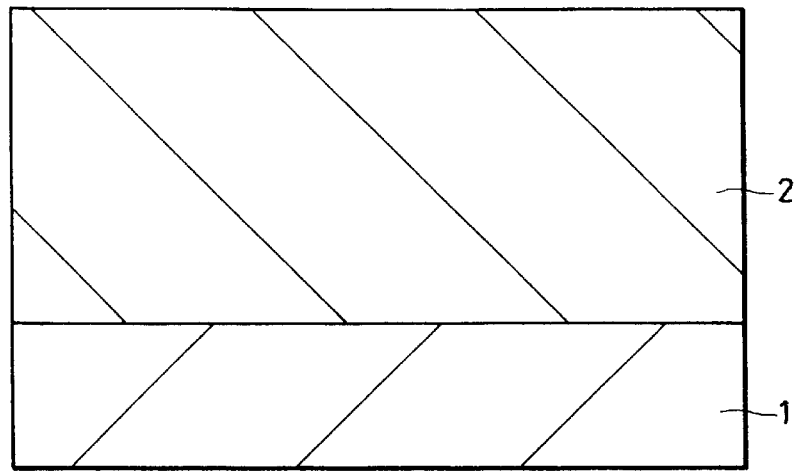
FIGS. 4A and 4B are cross-sectional views for explaining, a method for fabricating a contact plug according to the first embodiment of the invention.

In the contact plug fabricating method according to the first embodiment, first as shown in FIG. 4A, an inter-layer insulating film 2 of $SiO_2$ is formed on a Si film 1 in a sheet-type plasma CVD apparatus (not shown). The inter-layer insulating film 2 is 600 nm thick, for example. Exemplary CVD conditions for making the inter-layer insulating film 2 are: tetraethoxysilane (TEOS, $Si(O\!-\!C_2H_5)_4$) gas, helium (He) gas and oxygen ($O_2$) gas being used as the process gas, their flow rates beings 950 sccm, 550 sccm and 850 sccm, respectively, the pressure being 665 Pa, substrate heating temperature being 400° C., RF power being 600 W, and LF power being 150 W.

Figure 4B:
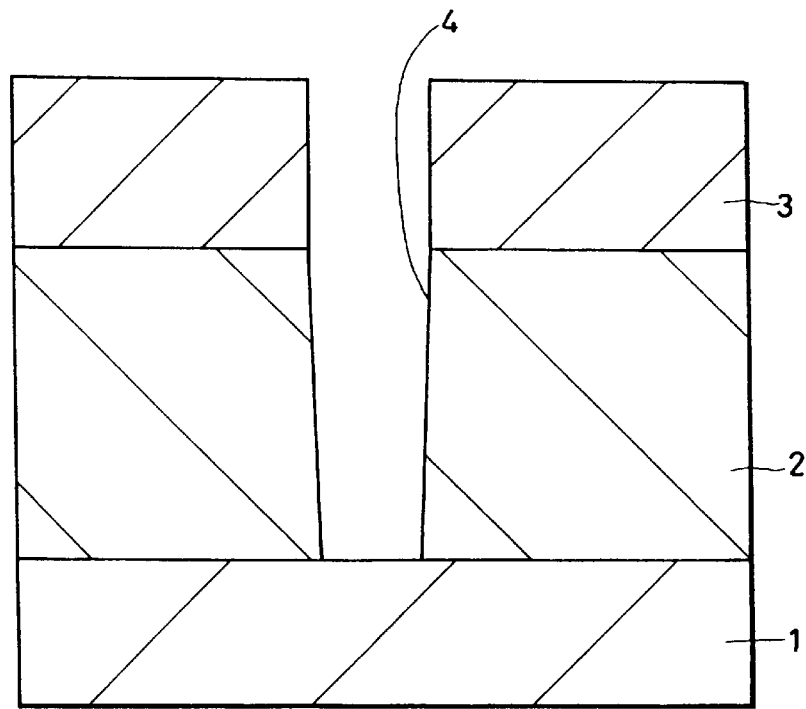

Next as shown in FIG. 4B, after a resist layer 3 is applied on the entire surface, a contact hole pattern with the diameter of 0.3 $\mu$m, for example, is formed by means of an excimer stopper, for example. After that, using the patterned resist layer 3 as a mask, the inter-layer insulating film 2 is etched by RIF, for example, to expose the surface of the Si substrate 1, thereby to make a contact hole 4 in the inter-layer insulating film 2. The resist layer 3 is removed thereafter.

Figure 5A:
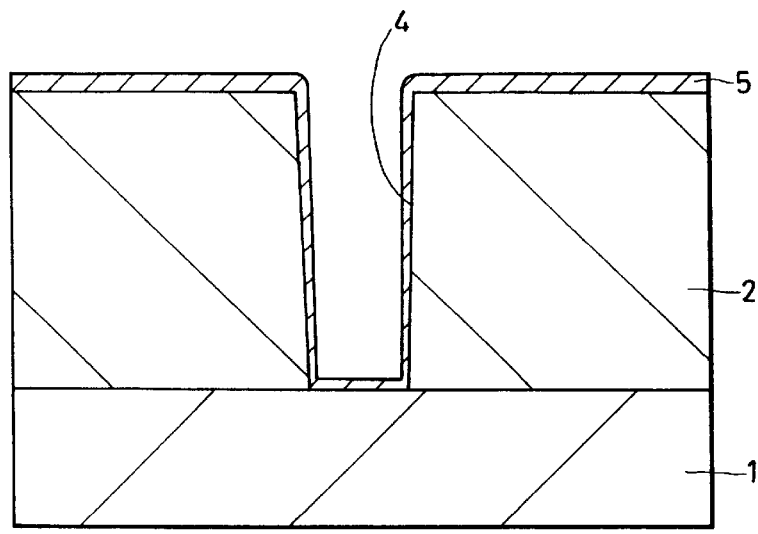
FIGS. 5A and 5B are cross-sectional views for explaining the method for fabricating a contact plug according to the first embodiment of the invention.

Next as shown in FIG. 5A, using long-throw sputtering, for example, a Ti film and a TiN film are sequentially formed on the entire surface of the inter-layer insulating film 2 to also cover the bottom surface and side wall of the contact hole 4, thereby to make a direct contact layer 5 in form of the Ti/TiN film. The Ti film is 10 nm thick, for example, and the TiN film is 40 nm, for example.

Figure 5B:
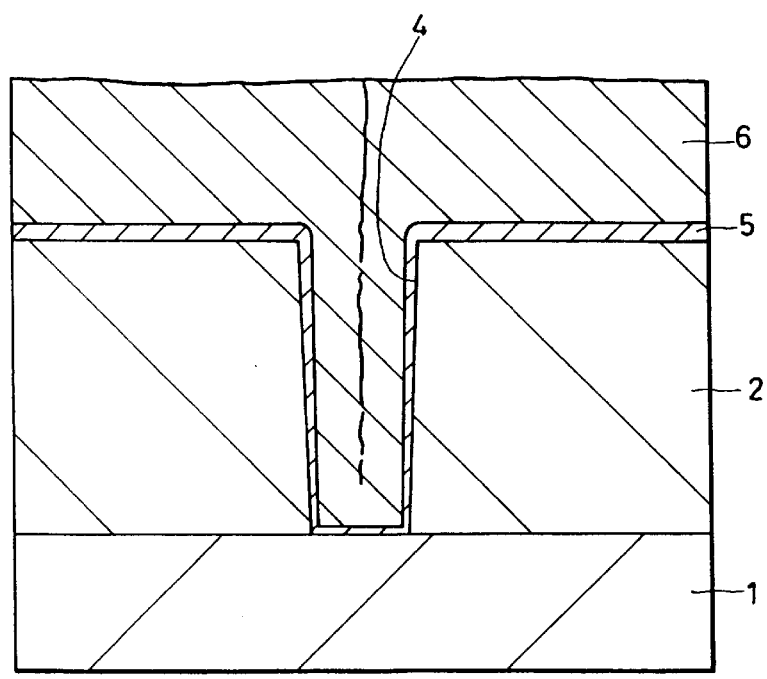

Next as shown in FIG. 5B, after the Si substrate 1 is moved into a deposition chamber (not shown), a W film 6 is formed on the direct-contact layer 5 by blanket W-CVD, for example. The W film 6 is 600 nm thick, for example. Exemplary CVD conditions of the W film 6 are: $WF_6$ gas and hydrogen ($H_2$) gas being used as the process gas, their flow rates being 80 sccm and 1000 sccm, respectively, argon (Ar) gas being used as the carrier gas, its flow rate being 500 sccm, the pressure being 10600 Pa, and the substrate heating temperature being 450° C.

Figure 6A:
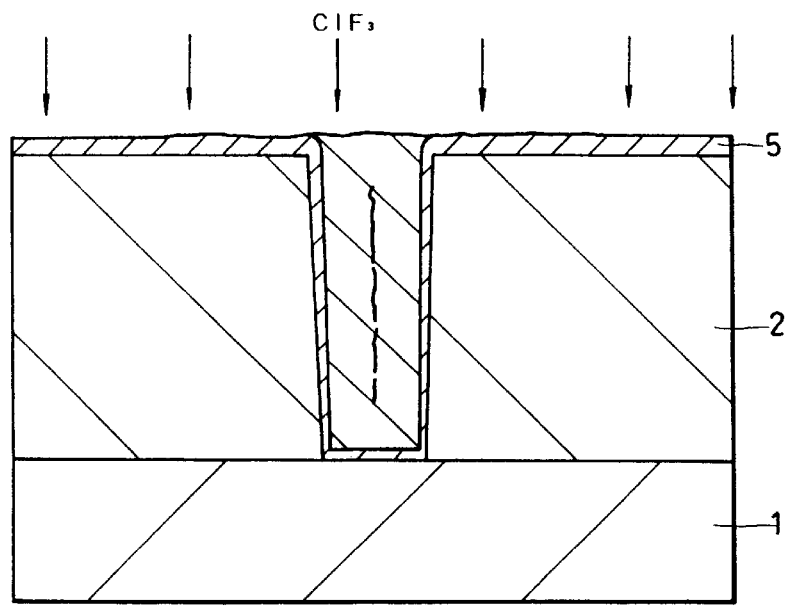
FIGS. 6A and 6B are cross-sectional views for explaining the method for fabricating a contact plug according to the first embodiment of the invention.

After the W film 6 is formed, chlorine trifluoride ($ClF_3$) gas is supplied into the deposition chamber used for making the W film 6. $ClF_3$ gas has a high reducing power. Using the $ClF_3$ gas as the etching gas, the W film 6 and the direct contact layer 5 are partly removed in sequence by an etch-back processing as shown in FIG. 6A. Exemplary etch-back conditions are: the flow rate of $ClF_3$ gas being 500 sccm, pressure being 133 Pa, substrate heating temperature being 250° C, and etching time being 60 seconds. In this case, $SiO_2$ is not etched substantially by $ClF_3$ gas. Therefore, only chemical reaction products on the inter-layer insulating film 2 can be removed, and no scum remains on the inter-layer insulating film 2.

Figure 6B:
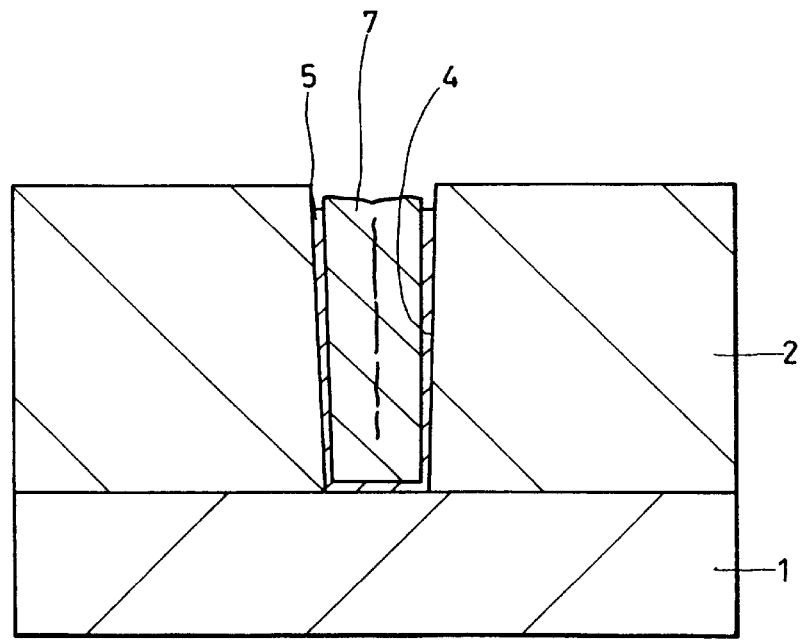

Through these steps, a contact plug 7 made of W deposited on the direct contact layer 5 as the base is formed inside the contact hole 4 as shown in FIG. 6B.

Using a sample prepared by these steps, an evaluation was made for any scum on the inter-layer insulating film 11. As a result, no scum was found, and it was confirmed that the contact plug had been made well. Also regarding the plug loss, it was 100 nm or less at the end portions and the central portion of the contact plug on the Si substrate 1.

If a wiring is made after the contact plug 7 is made, an Al film (not shown) is formed on the entire surface of the inter-layer insulating film 2 by sputtering, for example, and next patterned into the form of the wiring connected at least to the contact plug 7, thereby to make an Al wiring (not shown). After that, in the same manner as explained above, steps of making the inter-layer insulating film, contact hole (connection hole), Al film, and so on, are repeated to make a multi-layered wiring. Thus, a desired semiconductor device is obtained.

As explained above, according to the first embodiment, since $ClF_3$ gas exhibiting a high reducing property is used as the etching gas for etch-back processing by gas etching, the etching scum can be reduced. Therefore, there is 110 adverse affection of etching scum to a wiring made on an upper layer, and reliability of the wiring can be improved. Additionally, since $ClF_3$ gas has a strong reducing property, a plasma need not be used for etch-back processing unlike conventional RIE, and plasma damages can be prevented. Further, since a common chamber is used both for making the W film 6 and for its etch-back processing, the etch-back processing can be consecutively conducted immediately after the W film 6 is formed, and the process of fabricating the contact plug 7 call be simplified. Furthermore, since the deposition apparatus and the etching apparatus, or the deposition chamber and the etching chamber, can be incorporated into a single apparatus or a single chamber, the number of apparatuses required for the process can be reduced.

Figure 7A:
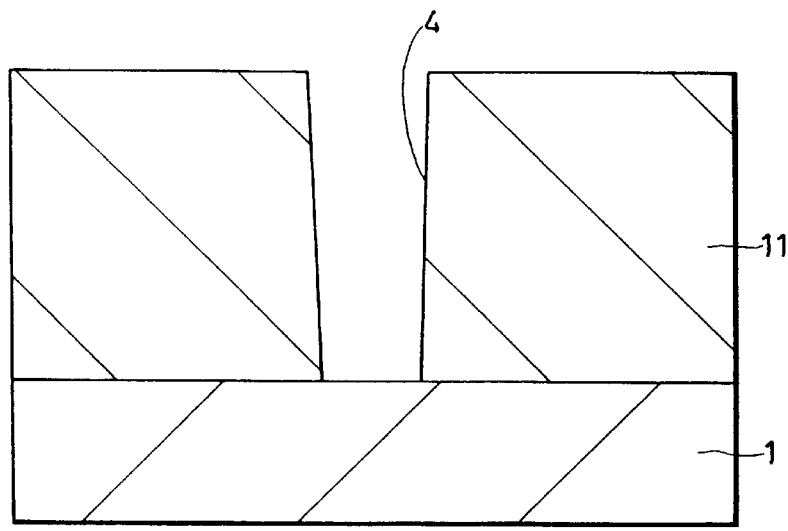
FIGS. 7A and 7B are cross-sectional views for explaining a method for fabricating a contact plug according to the second embodiment of the invention.
Figure 7B:
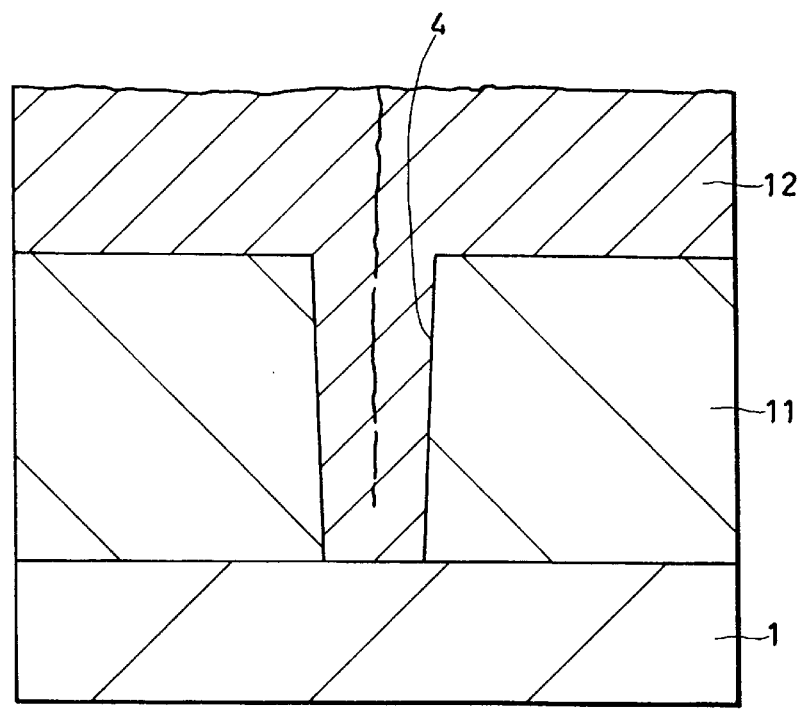
Figure 8:
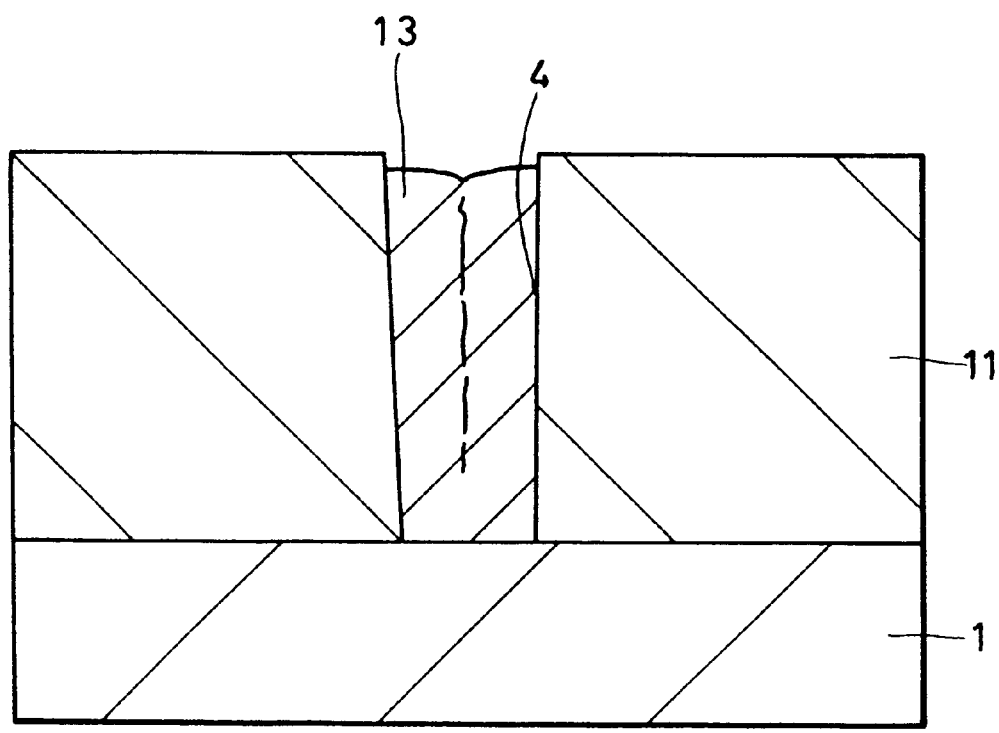
FIG. 8 is a cross-sectional view for explaining the method for fabricating a contact plug according to the second embodiment of the invention.

A contact plug fabricating method according to the second embodiment of the invention is now explained. FIGS. 7A through 8 show the contact plug fabricating method according to the second embodiment.

In the contact plug fabricating method according to the second embodiment, first as shown in FIG. 7A, an inter-layer insulating film 11 of $SiO_2$ is formed on the Si film 1 by a pressure-reduced CVD, for example. Exemplary CVD conditions for making the inter-layer insulating film 11 are: TEOS gas being used as the process gas, its flow rate being 150 sccm, the pressure being 50 Pa, and the substrate heating temperature being 700° C.

Then, after the Si substrate 1 is moved into a deposition chamber (not shown), a polycrystalline Si film 12 doped with an impurity such as P for example, is formed on the entire surface of the inter-layer insulating film 11 by CVD, for example, so as to bury the inside of the contact hole 4. Exemplary CVD conditions for making the polycrystalline Si film 12 are: mixed gas of silane ($SiH_4$) and phosphine ($PH_3$) gas diluted to 1% being used as the process gas, their flow rates being 1000 sccm and 50 sccm, respectively, the pressure being 65 Pa, and substrate heating temperature being 550° C.

After the polycrystalline Si film 12 is formed, $ClF_3$ gas is supplied into the deposition chamber in the same manner as the first embodiment, thereby to execute an etch-back processing of the polycrystalline Si film 12. Through these steps, a contact plug 13 made of the polycrystalline Si film 12 is obtained. In the other respects, the second embodiment is the same as the first embodiment, and their explanation is omitted.

Using a sample prepared by these steps, scum on the inter-layer insulating film 11 was evaluated. As a result, no scum was found, and it was confirmed that the contact plug had been made well.

If a wiring is made after the contact plug 7 is made, in the same manner as the first embodiment, an Al film (not shown), for example, is formed, and next patterned into the form of the desired wiring, thereby to make all Al wiring (not shown) connected to at least to the contact plug 7 on the inter-layer insulating film 11. After that, in the same manner as explained above, inter-layer insulating films, contact holes (connection hole), Al films, and so on, are repeatedly formed to make a multi-layered wiring.

The second embodiment also attains the same effects as those of the first embodiment.

Heretofore, the invention has been explained by way of specific embodiments. However, the invention is not limited to these embodiments but involves various changes and modifications based on the technical concept of the invention.

For example, numerical values, process gases and structures of the direct contact layer are not but examples, and any other appropriate numerical values process gases and structures of the direct contact layer can be used where necessary.

As described above, according to the invention, since an etching gas containing at least chlorine trifluoride is used for the etch-back processing of the conducting film, scum produced during fabrication of the plug can be reduced while ensuring a good configuration of the minute plug, and reliability of a wiring can be improved when the wiring is made on an upper layer.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A plug fabricating method comprising the steps of:
    forming an opening in an insulating film on a substrate;
    forming a direct contact layer on the insulating film;
    moving the substrate into a deposition chamber;
    forming a conducting film to bury the opening, the conducting film including a tungsten film; and
    partly removing the conducting film and direct contact layer in sequence by an etch-back processing to maintain the conducting film inside the opening,
    wherein the etch-back processing is conducted by using an etching gas containing at least chlorine trifluoride gas and wherein the etch-back processing is not performed by using a plasma,
    wherein the disposition chamber is used for both forming the conducting film and the etch-back processing.

2. A plug fabricating method according to claim 1 wherein said conducting film is made of tungsten or polycrystalline silicon.

3. A plug fabricating method according to claim 1 wherein said conducting film is deposited by chemical vapor deposition.

4. The plug fabricating method of claim 1, wherein the contact layer is a sequentially formed from a Ti film and a TiN film.

5. The plug fabricating method of claim 1, wherein the tungsten (W) film is formed using a process gas including at least a combination of $WF_6$ gas and hydrogen ($H_2$) gas.

6. The plug fabricating method of claim 5, wherein flow rates of the process gases are approximately 80 sccm and 1000 sccm respectively.

7. The plug fabricating method of claim 5, wherein a carrier gas includes at least Argon (Ar).

8. The plug fabricating method of claim 7, wherein the flow rate for the carrier gas is approximately 500 sccm.

9. The plug fabricating method of claim 8, wherein the carrier gas pressure is approximately 10600 Pa.

10. The plug fabricating method of claim 9, wherein the substrate heating temperature is approximately 450 degrees Celsius.

11. The plug fabricating method of claim 1, wherein the etch-back conditions include a flow rate of chlorine triflouride gas being approximately 500 sccm.

12. The plug fabricating method of claim 11, wherein the etch-back conditions include a chlorine triflouride gas pressure being approximately 133 Pa.

13. The plug fabricating method of claim 12, wherein the etch-back conditions include a substrate heating temperature of approximately 250 degrees Celsius.

14. The plug fabricating method of claim 13, wherein the etch-back conditions include an etching time of approximately 60 seconds.

15. A method having a sequential order of steps to fabricate a plug in a semiconductor device, the method comprising the following sequential order of steps:
    forming in an etching chamber a first opening in an insulating film on a substrate;
    forming in the etching chamber a second opening by disposing a direct contact layer on an entire surface of the insulating film so that the direct contact layer is in contact with the substrate;
    moving the substrate into a deposition chamber from the first chamber;
    in the disposition chamber, disposing a tungsten film on the entire surface of the insulating layer to bury the second opening;
    supplying a chlorine trifluoride etching gas into the same disposition chamber as used to dispose the tungsten film on the insulating layer;
    selectively removing the tungsten film using the chlorine trifluoride etching gas by performing an etch-back processing; and
    selectively removing the direct contact layer by performing the etch-back processing using the same chlorine trifluoride etching gas as used to remove the tungsten film,
    wherein the etch-back processing is performed without using a plasma etching gas.

16. The method of claim 15, wherein the etching chamber and the disposition chamber are incorporated into a single apparatus.

17. The method of claim 15, wherein a flow rate of the chlorine trifluoride etching gas is approximately 500 standard cubic centimeters/minute (sccm).

18. The method of claim 15, wherein a pressure in the disposition chamber is approximately 133 Pascals.

19. The method of claim 15, wherein the substrate experiences a heating temperature of approximately 250 degrees Celsius.

20. The method of claim 15, wherein etching time of the etch-back processing is approximately 60 seconds.

* * * * *